(12) United States Patent
Kulkarni et al.

(10) Patent No.: US 8,781,781 B2
(45) Date of Patent: Jul. 15, 2014

(54) DYNAMIC CARE AREAS

(75) Inventors: Ashok V. Kulkarni, San Jose, CA (US); Chien-Huei Adam Chen, San Jose, CA (US)

(73) Assignee: KLA-Tencor Corp., Milpitas, CA (US)

(*) Notice: Subject to any disclaimer, the term of this patent is extended or adjusted under 35 U.S.C. 154(b) by 268 days.

(21) Appl. No.: 13/174,556

(22) Filed: Jun. 30, 2011

(65) Prior Publication Data
US 2012/0029858 A1     Feb. 2, 2012

Related U.S. Application Data

(60) Provisional application No. 61/369,641, filed on Jul. 30, 2010.

(51) Int. Cl.
    *G06F 19/00*     (2011.01)
    *G05B 23/02*     (2006.01)

(52) U.S. Cl.
    CPC ................ *G05B 23/0297* (2013.01)
    USPC .......................................................... 702/108

(58) Field of Classification Search
    CPC .................................................. G05B 23/0297
    USPC .......................................................... 702/108
    See application file for complete search history.

(56) References Cited

U.S. PATENT DOCUMENTS

| | | | |
|---|---|---|---|
| 3,495,269 A | 2/1970 | Mutschler et al. |
| 3,496,352 A | 2/1970 | Jugle |
| 3,909,602 A | 9/1975 | Micka |
| 4,015,203 A | 3/1977 | Verkuil |
| 4,247,203 A | 1/1981 | Levy et al. |
| 4,347,001 A | 8/1982 | Levy et al. |
| 4,378,159 A | 3/1983 | Galbraith |
| 4,448,532 A | 5/1984 | Joseph et al. |
| 4,475,122 A | 10/1984 | Green |
| 4,532,650 A | 7/1985 | Wihl et al. |
| 4,555,798 A | 11/1985 | Broadbent, Jr. et al. |
| 4,578,810 A | 3/1986 | MacFarlane et al. |
| 4,579,455 A | 4/1986 | Levy et al. |
| 4,595,289 A | 6/1986 | Feldman et al. |
| 4,599,558 A | 7/1986 | Castellano, Jr. et al. |
| 4,633,504 A | 12/1986 | Wihl |

(Continued)

FOREIGN PATENT DOCUMENTS

| | | |
|---|---|---|
| CN | 1339140 | 3/2002 |
| CN | 1398348 | 2/2003 |

(Continued)

OTHER PUBLICATIONS

International Preliminary Report on Patentability for PCT/US2011/045610 mailed Feb. 14, 2013.

(Continued)

*Primary Examiner* — Bryan Bui
(74) *Attorney, Agent, or Firm* — Ann Marie Mewherter

(57) ABSTRACT

Various embodiments for determining dynamic care areas are provided. In one embodiment, a first inspection process is performed on a wafer after a first fabrication step has been performed on the wafer and before a second fabrication process has been performed on the wafer. One embodiment includes determining care areas for a second inspection process based on inspection results generated by the first inspection process. The second inspection process will be performed on the wafer after the second fabrication step has been performed on the wafer.

16 Claims, 6 Drawing Sheets

(56) References Cited

U.S. PATENT DOCUMENTS

| | | |
|---|---|---|
| 4,641,353 A | 2/1987 | Kobayashi |
| 4,641,967 A | 2/1987 | Pecen |
| 4,734,721 A | 3/1988 | Boyer et al. |
| 4,748,327 A | 5/1988 | Shinozaki et al. |
| 4,758,094 A | 7/1988 | Wihl et al. |
| 4,766,324 A | 8/1988 | Saadat et al. |
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,124,927 A | 6/1992 | Hopewell et al. |
| 5,189,481 A | 2/1993 | Jann et al. |
| 5,355,212 A | 10/1994 | Wells et al. |
| 5,444,480 A | 8/1995 | Sumita |
| 5,453,844 A | 9/1995 | George et al. |
| 5,481,624 A | 1/1996 | Kamon |
| 5,485,091 A | 1/1996 | Verkuil |
| 5,497,381 A | 3/1996 | O'Donoghue et al. |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edgar et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung et al. |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,822,218 A | 10/1998 | Moosa et al. |
| 5,831,865 A | 11/1998 | Berezin et al. |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,917,332 A | 6/1999 | Chen et al. |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,978,501 A | 11/1999 | Badger et al. |
| 5,980,187 A | 11/1999 | Verhovsky |
| 5,986,263 A | 11/1999 | Hiroi et al. |
| 5,991,699 A | 11/1999 | Kulkarni et al. |
| 5,999,003 A | 12/1999 | Steffan et al. |
| 6,011,404 A | 1/2000 | Ma et al. |
| 6,014,461 A | 1/2000 | Hennessey et al. |
| 6,040,912 A | 3/2000 | Zika et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,117,598 A | 9/2000 | Imai |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller et al. |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,215,551 B1 | 4/2001 | Nikoonahad et al. |
| 6,224,638 B1 | 5/2001 | Jevtic et al. |
| 6,233,719 B1 | 5/2001 | Hardikar et al. |
| 6,246,787 B1 | 6/2001 | Hennessey et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Eichel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,324,298 B1 | 11/2001 | O'Dell et al. |
| 6,344,640 B1 | 2/2002 | Rhoads |
| 6,363,166 B1 | 3/2002 | Wihl et al. |
| 6,373,975 B1 | 4/2002 | Bula et al. |
| 6,388,747 B2 | 5/2002 | Nara et al. |
| 6,393,602 B1 | 5/2002 | Atchison et al. |
| 6,407,373 B1 | 6/2002 | Dotan |
| 6,415,421 B2 | 7/2002 | Anderson et al. |
| 6,445,199 B1 | 9/2002 | Satya et al. |
| 6,451,690 B1 | 9/2002 | Matsumoto et al. |
| 6,459,520 B1 | 10/2002 | Takayama |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Bareket et al. |
| 6,631,511 B2 | 10/2003 | Haffner et al. |
| 6,636,301 B1 | 10/2003 | Kvamme et al. |
| 6,642,066 B1 | 11/2003 | Halliyal et al. |
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 | 4/2004 | Chen et al. |
| 6,734,696 B2 | 5/2004 | Horner et al. |
| 6,738,954 B1 | 5/2004 | Allen et al. |
| 6,748,103 B2 | 6/2004 | Glasser et al. |
| 6,751,519 B1 | 6/2004 | Satya et al. |
| 6,753,954 B2 | 6/2004 | Chen |
| 6,757,645 B2 | 6/2004 | Chang et al. |

(56) References Cited

U.S. PATENT DOCUMENTS

| | | |
|---|---|---|
| 6,759,655 B2 | 7/2004 | Nara et al. |
| 6,771,806 B1 | 8/2004 | Satya et al. |
| 6,775,818 B2 | 8/2004 | Taravade et al. |
| 6,777,147 B1 | 8/2004 | Fonseca et al. |
| 6,777,676 B1 | 8/2004 | Wang et al. |
| 6,778,695 B1 | 8/2004 | Schellenberg et al. |
| 6,779,159 B2 | 8/2004 | Yokoyama et al. |
| 6,784,446 B1 | 8/2004 | Phan et al. |
| 6,788,400 B2 | 9/2004 | Chen |
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,842,225 B1 | 1/2005 | Irie |
| 6,859,746 B1 | 2/2005 | Stirton |
| 6,879,403 B2 | 4/2005 | Freifeld |
| 6,879,924 B2 | 4/2005 | Ye et al. |
| 6,882,745 B2 | 4/2005 | Brankner et al. |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,919,957 B2 | 7/2005 | Nikoonahad et al. |
| 6,937,753 B1 | 8/2005 | O'Dell et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane et al. |
| 7,027,143 B1 | 4/2006 | Stokowski et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang et al. |
| 7,071,833 B2 | 7/2006 | Nagano et al. |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,143 B2 | 9/2006 | Hanson et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 | 10/2006 | Stokowski et al. |
| 7,124,386 B2 | 10/2006 | Smith et al. |
| 7,133,548 B2 | 11/2006 | Kenan et al. |
| 7,135,344 B2 | 11/2006 | Nehmadi et al. |
| 7,136,143 B2 | 11/2006 | Smith |
| 7,152,215 B2 | 12/2006 | Smith et al. |
| 7,162,071 B2 | 1/2007 | Hung et al. |
| 7,171,334 B2 | 1/2007 | Gassner |
| 7,174,520 B2 | 2/2007 | White et al. |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,271,891 B1 | 9/2007 | Xiong et al. |
| 7,379,175 B1 | 5/2008 | Stokowski et al. |
| 7,383,156 B2 | 6/2008 | Matsusita et al. |
| 7,386,839 B1 | 6/2008 | Golender et al. |
| 7,388,979 B2 | 6/2008 | Sakai et al. |
| 7,418,124 B2 | 8/2008 | Peterson et al. |
| 7,424,145 B2 | 9/2008 | Horie et al. |
| 7,440,093 B1 | 10/2008 | Xiong et al. |
| 7,570,796 B2 | 8/2009 | Zafar et al. |
| 7,676,077 B2 | 3/2010 | Kulkarni et al. |
| 7,683,319 B2 | 3/2010 | Makino et al. |
| 7,738,093 B2 | 6/2010 | Alles et al. |
| 7,739,064 B1 | 6/2010 | Ryker et al. |
| 7,760,929 B2 | 7/2010 | Orbon et al. |
| 7,877,722 B2 | 1/2011 | Duffy et al. |
| 7,890,917 B1 | 2/2011 | Young et al. |
| 7,904,845 B2 | 3/2011 | Fouquet et al. |
| 7,968,859 B2 * | 6/2011 | Young et al. ............... 250/559.4 |
| 8,073,240 B2 | 12/2011 | Fischer et al. |
| 8,126,255 B2 | 2/2012 | Bhaskar et al. |
| 2001/0017694 A1 | 8/2001 | Oomori et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0010560 A1 | 1/2002 | Balachandran |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose et al. |
| 2002/0035717 A1 | 3/2002 | Matsuoka |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0145734 A1 | 10/2002 | Watkins et al. |
| 2002/0164065 A1 | 11/2002 | Cai et al. |
| 2002/0176096 A1 | 11/2002 | Sentoku et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0004699 A1 | 1/2003 | Choi et al. |
| 2003/0014146 A1 | 1/2003 | Fujii et al. |
| 2003/0017664 A1 | 1/2003 | Pnueli et al. |
| 2003/0022401 A1 | 1/2003 | Hamamatsu et al. |
| 2003/0033046 A1 | 2/2003 | Yoshitake et al. |
| 2003/0048458 A1 | 3/2003 | Mieher et al. |
| 2003/0048939 A1 | 3/2003 | Lehman |
| 2003/0057971 A1 | 3/2003 | Nishiyama et al. |
| 2003/0076989 A1 | 4/2003 | Maayah et al. |
| 2003/0086081 A1 | 5/2003 | Lehman |
| 2003/0094572 A1 | 5/2003 | Matsui et al. |
| 2003/0098805 A1 | 5/2003 | Bizjak et al. |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0173516 A1 | 9/2003 | Takane et al. |
| 2003/0192015 A1 | 10/2003 | Liu |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0227620 A1 | 12/2003 | Hirokazu et al. |
| 2003/0228714 A1 | 12/2003 | Smith et al. |
| 2003/0229410 A1 | 12/2003 | Smith et al. |
| 2003/0229412 A1 | 12/2003 | White et al. |
| 2003/0229868 A1 | 12/2003 | White et al. |
| 2003/0229875 A1 | 12/2003 | Smith et al. |
| 2003/0229880 A1 | 12/2003 | White et al. |
| 2003/0229881 A1 | 12/2003 | White et al. |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0049722 A1 | 3/2004 | Matsushita |
| 2004/0052411 A1 | 3/2004 | Qian et al. |
| 2004/0057611 A1 | 3/2004 | Lee et al. |
| 2004/0066506 A1 | 4/2004 | Elichai et al. |
| 2004/0091142 A1 | 5/2004 | Peterson et al. |
| 2004/0094762 A1 | 5/2004 | Hess et al. |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0120569 A1 | 6/2004 | Hung et al. |

(56) References Cited

U.S. PATENT DOCUMENTS

| | | |
|---|---|---|
| 2004/0133369 A1 | 7/2004 | Pack et al. |
| 2004/0147121 A1 | 7/2004 | Nakagaki et al. |
| 2004/0174506 A1 | 9/2004 | Smith |
| 2004/0179738 A1 | 9/2004 | Long et al. |
| 2004/0199885 A1 | 10/2004 | Lu et al. |
| 2004/0223639 A1 | 11/2004 | Sato et al. |
| 2004/0228515 A1 | 11/2004 | Okabe et al. |
| 2004/0234120 A1 | 11/2004 | Honda et al. |
| 2004/0243320 A1 | 12/2004 | Chang et al. |
| 2004/0246476 A1 | 12/2004 | Bevis et al. |
| 2004/0254752 A1 | 12/2004 | Wisniewski et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0013474 A1 | 1/2005 | Hak |
| 2005/0062962 A1 | 3/2005 | Fairley et al. |
| 2005/0069217 A1 | 3/2005 | Debargha |
| 2005/0117796 A1 | 6/2005 | Matsui et al. |
| 2005/0132306 A1 | 6/2005 | Smith et al. |
| 2005/0141764 A1 | 6/2005 | Tohyama et al. |
| 2005/0166174 A1 | 7/2005 | Ye et al. |
| 2005/0184252 A1 | 8/2005 | Ogawa et al. |
| 2005/0190957 A1 | 9/2005 | Cai et al. |
| 2005/0198602 A1 | 9/2005 | Brankner et al. |
| 2006/0000964 A1 | 1/2006 | Ye et al. |
| 2006/0036979 A1 | 2/2006 | Zurbrick et al. |
| 2006/0038986 A1 | 2/2006 | Honda et al. |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0066339 A1 | 3/2006 | Rajski et al. |
| 2006/0082763 A1 | 4/2006 | Teh et al. |
| 2006/0159333 A1 | 7/2006 | Ishikawa |
| 2006/0161452 A1 | 7/2006 | Hess |
| 2006/0193506 A1 | 8/2006 | Dorphan et al. |
| 2006/0193507 A1 | 8/2006 | Sali et al. |
| 2006/0236294 A1 | 10/2006 | Saidin et al. |
| 2006/0236297 A1 | 10/2006 | Melvin, III et al. |
| 2006/0239536 A1 | 10/2006 | Shibuya et al. |
| 2006/0265145 A1 | 11/2006 | Huet et al. |
| 2006/0266243 A1 | 11/2006 | Percin et al. |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |
| 2006/0277520 A1 | 12/2006 | Gennari |
| 2006/0291714 A1 | 12/2006 | Wu et al. |
| 2006/0292463 A1 | 12/2006 | Best et al. |
| 2007/0002322 A1 | 1/2007 | Borodovsky et al. |
| 2007/0011628 A1 | 1/2007 | Ouali et al. |
| 2007/0013901 A1 | 1/2007 | Kim et al. |
| 2007/0019171 A1 | 1/2007 | Smith |
| 2007/0019856 A1 | 1/2007 | Dov et al. |
| 2007/0031745 A1 | 2/2007 | Ye et al. |
| 2007/0032896 A1 | 2/2007 | Ye et al. |
| 2007/0035322 A1 | 2/2007 | Kang et al. |
| 2007/0035712 A1 | 2/2007 | Gassner et al. |
| 2007/0035728 A1 | 2/2007 | Kekare et al. |
| 2007/0052963 A1 | 3/2007 | Orbon et al. |
| 2007/0064995 A1 | 3/2007 | Oaki et al. |
| 2007/0133860 A1 | 6/2007 | Lin et al. |
| 2007/0156379 A1* | 7/2007 | Kulkarni et al. ............... 703/14 |
| 2007/0230770 A1 | 10/2007 | Kulkarni et al. |
| 2007/0248257 A1 | 10/2007 | Bruce et al. |
| 2007/0280527 A1 | 12/2007 | Almogy et al. |
| 2007/0288219 A1 | 12/2007 | Zafar et al. |
| 2008/0013083 A1 | 1/2008 | Kirk et al. |
| 2008/0018887 A1* | 1/2008 | Chen et al. ............... 356/237.2 |
| 2008/0049994 A1 | 2/2008 | Rognin et al. |
| 2008/0058977 A1 | 3/2008 | Honda |
| 2008/0072207 A1 | 3/2008 | Verma et al. |
| 2008/0081385 A1 | 4/2008 | Marella et al. |
| 2008/0163140 A1 | 7/2008 | Fouquet et al. |
| 2008/0167829 A1 | 7/2008 | Park et al. |
| 2008/0250384 A1 | 10/2008 | Duffy et al. |
| 2008/0295047 A1 | 11/2008 | Nehmadi et al. |
| 2008/0295048 A1 | 11/2008 | Nehmadi et al. |
| 2008/0304056 A1 | 12/2008 | Alles et al. |
| 2009/0024967 A1 | 1/2009 | Su et al. |
| 2009/0037134 A1 | 2/2009 | Kulkarni et al. |
| 2009/0041332 A1 | 2/2009 | Bhaskar et al. |
| 2009/0043527 A1 | 2/2009 | Park et al. |
| 2009/0055783 A1 | 2/2009 | Florence et al. |
| 2009/0080759 A1 | 3/2009 | Bhaskar et al. |
| 2009/0210183 A1 | 8/2009 | Rajski et al. |
| 2009/0257645 A1 | 10/2009 | Chen et al. |
| 2009/0284733 A1 | 11/2009 | Wallingford et al. |
| 2009/0290782 A1 | 11/2009 | Regensburger |
| 2010/0142800 A1 | 6/2010 | Pak et al. |
| 2010/0146338 A1 | 6/2010 | Schalick et al. |
| 2010/0150429 A1 | 6/2010 | Jau et al. |
| 2011/0052040 A1 | 3/2011 | Kuan |
| 2011/0184662 A1 | 7/2011 | Badger et al. |
| 2012/0319246 A1 | 12/2012 | Tan et al. |
| 2013/0009989 A1 | 1/2013 | Chen et al. |
| 2013/0027196 A1 | 1/2013 | Yankun et al. |

FOREIGN PATENT DOCUMENTS

| | | |
|---|---|---|
| CN | 1646896 | 7/2005 |
| EP | 0032197 | 7/1981 |
| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |
| EP | 1093017 | 4/2001 |
| EP | 1329771 | 7/2003 |
| EP | 1480034 | 11/2004 |
| EP | 1696270 | 8/2006 |
| JP | 7-159337 | 6/1995 |
| JP | 2002071575 | 3/2002 |
| JP | 2002-365235 | 12/2002 |
| JP | 2003-215060 | 7/2003 |
| JP | 2004-045066 | 2/2004 |
| JP | 2005-283326 | 10/2005 |
| JP | 2009-122046 | 6/2009 |
| KR | 10-2001-0007394 | 1/2001 |
| KR | 10-2001-0037026 | 5/2001 |
| KR | 10-2001-0101697 | 11/2001 |
| KR | 1020030055848 | 7/2003 |
| KR | 10-2005-0092053 | 9/2005 |
| KR | 10-2006-0075691 | 7/2006 |
| KR | 10-2010-0061018 | 6/2010 |
| WO | 9857358 | 12/1998 |
| WO | 9922310 | 5/1999 |
| WO | 9925004 | 5/1999 |
| WO | 9959200 | 5/1999 |
| WO | 9938002 | 7/1999 |
| WO | 9941434 | 8/1999 |
| WO | 0003234 | 1/2000 |
| WO | 0036525 | 6/2000 |
| WO | 0055799 | 9/2000 |
| WO | 0068884 | 11/2000 |
| WO | 0070332 | 11/2000 |
| WO | 0109566 | 2/2001 |
| WO | 0140145 | 6/2001 |
| WO | 03104921 | 12/2003 |
| WO | 2004027684 | 4/2004 |
| WO | 2006063268 | 6/2006 |
| WO | 2010/093733 | 8/2010 |

OTHER PUBLICATIONS

Huang et al., "Using Design Based Binning to Improve Defect Excursion Control for 45nm Production," IEEE, International Symposium on Semiconductor Manufacturing, Oct. 2007, pp. 1-3.

Sato et al., "Defect Criticality Index (DCI): A new methodology to significantly improve DOI sampling rate in a 45nm production environment," Metrology, Inspection, and Process Control for Microlithography XXII, Proc. of SPIE vol. 6922, 692213 (2008), pp. 1-9.

(56) References Cited

OTHER PUBLICATIONS

Tang et al., "Analyzing Volume Diagnosis Results with Statistical Learning for Yield Improvement" 12th IEEE European Test Symposium, Freiburg 2007, IEEE European, May 20-24, 2007, pp. 145-150.
International Search Report and Written Opinion for PCT/US2011/045610 mailed Mar. 12, 2012.
Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.
Sahouria et al., "Full-chip Process Simulation for Silicon DRC," Mentor Graphics, Mar. 2000, 6 pages.
Schroder et al., Corona-Oxide-Semiconductor Device Characterization, 1998, Solid-State Electronics, vol. 42, No. 4, pp. 505-512.
Schroder, "Surface voltage and surface photovoltage: history, theory and applications," Measurement Science and Technology, vol. 12, 2001, pp. R16-R31.
Schroder, Contactless Surface Charge Semiconductor Characterization, Apr. 2002, Materials Science and Engineering B, vol. 91-92, pp. 196-228.
Schurz et al., "Simulation Study of Reticle Enhancement Technology Applications for 157 nm Lithography," SPIE vol. 4562, 2002, pp. 902-913.
Svidenko et al. "Dynamic Defect-Limited Yield Prediction by Criticality Factor," ISSM Paper: YE-O-157, 2007.
Verkuil et al., "A Contactless Alternative to MOS Charge Measurements by Means of a Corona-Oxide-Semiconductor (COS) Technique, "Electrochem. Soc. Extended Abstracts, 1988, vol. 88-1, No. 169, pp. 261-262.
Verkuil, "Rapid Contactless Method for Measuring Fixed Oxide Charge Associated with Silicon Processing," IBM Technical Disclosure Bulletin, vol. 24, No. 6, 1981, pp. 3048-3053.
Volk et al. "Investigation of Reticle Defect Formation at DUV Lithography," 2002, BACUS Symposium on Photomask Technology.
Volk et al. "Investigation of Reticle Defect Formation at DUV Lithography," 2003, IEEE/SEMI Advanced Manufacturing Conference, pp. 29-35.
Volk et al., "Investigation of Smart Inspection of Critical Layer Reticles using Additional Designer Data to Determine Defect Significance," Proceedings of SPIE vol. 5256, 2003, pp. 489-499.
Weinberg, "Tunneling of Electrons from Si into Thermally Grown SiO2," Solid-State Electronics, 1977, vol. 20, pp. 11-18.
Weinzierl et al., "Non-Contact Corona-Based Process Control Measurements: Where We've Been, Where We're Headed," Electrochemical Society Proceedings, Oct. 1999, vol. 99-16, pp. 342-350.
Yan et al., "Printability of Pellicle Defects in DUV 0.5 um Lithography," SPIE vol. 1604, 1991, pp. 106-117.
U.S. Appl. No. 60/681,095, filed May 13, 2005, by Nehmadi et al.
U.S. Appl. No. 60/684,360, filed May 24, 2005, by Nehmadi et al.
U.S. Appl. No. 10/778,752, filed Feb. 13, 2004, by Preil et al.
U.S. Appl. No. 10/793,599, filed Apr. 4, 2004, by Howard et al.
U.S. Appl. No. 11/139,151, filed Feb. 10, 2005, by Volk.
U.S. Appl. No. 11/154,310, filed Feb. 10, 2005, by Verma et al.
U.S. Appl. No. 12/394,752, filed Feb. 27, 2009, by Xiong et al.
U.S. Appl. No. 12/403,905, filed Mar. 13, 2009, by Xiong.
Allan et al., "Critical Area Extraction for Soft Fault Estimation," IEEE Transactions on Semiconductor Manufacturing, vol. 11, No. 1, Feb. 1998.
Barty et al., "Aerial Image Microscopes for the inspection of defects in EUV masks," Proceedings of SPIE, vol. 4889, 2002, pp. 1073-1084.
Budd et al., "A New Mask Evaluation Tool, the Microlithography Simulation Microscope Aerial Image Measurement System," SPIE vol. 2197, 1994, pp. 530-540.
Cai et al., "Enhanced Dispositioning of Reticle Defects Using the Virtual Stepper With Automated Defect Severity Scoring," Proceedings of the SPIE, vol. 4409, Jan. 2001, pp. 467-478.
Comizzoli, "Uses of Corona Discharges in the Semiconductor Industry," J. Electrochem. Soc., 1987, pp. 424-429.
Contactless Electrical Equivalent Oxide Thickness Measurement, IBM Technical Disclosure Bulletin, vol. 29, No. 10, 1987, pp. 4622-4623.
Contactless Photovoltage vs. Bias Method for Determining Flat-Band Voltage, IBM Technical Disclosure Bulletin, vol. 32, vol. 9A, 1990, pp. 14-17.
Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.
Diebold et al., "Characterization and production metrology of thin transistor gate oxide films," Materials Science in Semiconductor Processing 2, 1999, pp. 103-147.
Dirksen et al., "Impact of high order aberrations on the performance of the aberration monitor," Proc. of SPIE vol. 4000, Mar. 2000, pp. 9-17.
Dirksen et al., "Novel aberration monitor for optical lithography," Proc. of SPIE vol. 3679, Jul. 1999, pp. 77-86.
Garcia et al., "New Die to Database Inspection Algorithm for Inspection of 90-nm Node Reticles," Proceedings of SPIE, vol. 5130, 2003, pp. 364-374.
Granik et al., "Sub-resolution process windows and yield estimation technique based on detailed full-chip CD simulation," Mentor Graphics, Sep. 2000, 5 pages.
Hess et al., "A Novel Approach: High Resolution Inspection with Wafer Plane Defect Detection," Proceedings of SPIE—International Society for Optical Engineering; Photomask and Next-Generation Lithography Mask Technology 2008, vol. 7028, 2008.
Huang et al., "Process Window Impact of Progressive Mask Defects, Its Inspection and Disposition Techniques (go/no-go criteria) Via a Lithographic Detector," Proceedings of SPIE—The International Society for Optical Engineering; 25th Annual Bacus Symposium on Photomask Technology 2005, vol. 5992, No. 1, 2005, p. 6.
Hung et al., Metrology Study of Sub 20 Angstrom oxynitride by Corona-Oxide-Silicon (COS) and Conventional C-V Approaches, 2002, Mat. Res. Soc. Symp. Proc., vol. 716, pp. 119-124.
International Search Report for PCT/US2003/021907 mailed Jun. 7, 2004.
International Search Report for PCT/US2004/040733 mailed Dec. 23, 2005.
International Search Report for PCT/US2006/061112 mailed Sep. 25, 2008.
International Search Report for PCT/US2006/061113 mailed Jul. 16, 2008.
International Search Report for PCT/US2008/050397 mailed Jul. 11, 2008.
International Search Report for PCT/US2008/062873 mailed Aug. 12, 2008.
International Search Report for PCT/US2008/062875 mailed Sep. 10, 2008.
International Search Report for PCT/US2008/063008 mailed Aug. 18, 2008.
International Search Report for PCT/US2008/066328 mailed Oct. 1, 2009.
International Search Report for PCT/US2008/070647 mailed Dec. 16, 2008.
International Search Report for PCT/US2008/072636 mailed Jan. 29, 2009.
International Search Report for PCT/US2008/073706 mailed Jan. 29, 2009.
Karklin et al., "Automatic Defect Severity Scoring for 193 nm Reticle Defect Inspection," Proceedings of SPIE—The International Society for Optical Engineering, 2001, vol. 4346, No. 2, pp. 898-906.
Lo et al., "Identifying Process Window Marginalities of Reticle Designs for 0.15/0.13μm Technologies," Proceedings of SPIE vol. 5130, 2003, pp. 829-837.
Lorusso et al. "Advanced DFM Applns. Using design-based metrology on CDSEM," SPIE vol. 6152, Mar. 27, 2006.
Lu et al., "Application of Simulation Based Defect Printability Analysis for Mask Qualification Control," Proceedings of SPIE, vol. 5038, 2003, pp. 33-40.

(56) References Cited

OTHER PUBLICATIONS

Mack, "Lithographic Simulation: A Review," Proceedings of SPIE vol. 4440, 2001, pp. 59-72.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Nagpal et al., "Wafer Plane Inspection for Advanced Reticle Defects," Proceedings of SPIE—The International Society for Optical Engineering; Photomask and Next-Generation Lithography Mask Technology. vol. 7028, 2008.

Numerical Recipes in C. The Art of Scientific Computing, 2nd Ed., © Cambridge University Press 1988, 1992, p. 683.

O'Gorman et al., "Subpixel Registration Using a Concentric Ring Fiducial," Proceedings of the International Conference on Pattern Recognition, vol. ii, Jun. 16, 1990, pp. 249-253.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al., "Simulation-based Defect Printability Analysis on Alternating Phase Shifting Masks for 193 nm Lithography," Proceedings of SPIE, vol. 4889, 2002, pp. 947-954.

Pettibone et al., "Wafer Printability Simulation Accuracy Based on UV Optical Inspection Images of Reticle Defects," Proceedings of SPIE—The International Society for Optical Engineering 1999 Society of Photo-Optical Instrumentation Engineers, vol. 3677, No. II, 1999, pp. 711-720.

U.S. Appl. No. 13/652,377, filed Oct. 15, 2012, by Wu et al.

Guo et al., "License Plate Localization and Character Segmentation with Feedback Self-Learning and Hybrid Binarization Techniques," IEEE Transactions on Vehicular Technology, vol. 57, No. 3, May 2008, pp. 1417-1424.

Liu, "Robust Image Segmentation Using Local Median," Proceedings of the 3rd Canadian Conference on Computer and Robot Vision (CRV'06) 0-7695-2542-3/06, 2006 IEEE, 7 pages total.

\* cited by examiner

DYNAMIC CARE AREAS

CROSS-REFERENCE TO RELATED APPLICATIONS

This application claims priority to U.S. Patent Application Ser. No. 61/369,641 entitled "Dynamic Micro-Care Areas for Inspection," filed Jul. 30, 2010, which is incorporated by reference as if fully set forth herein.

BACKGROUND OF THE INVENTION

1. Field of the Invention

The present invention generally relates to determining dynamic care areas.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

While it is important to detect defects on wafers, it is also important to determine the origin of the defects so that the cause of the defects can be eliminated. One current method of tracking the origin of defects is defect source analysis (DSA). In this method, the defect locations for inspection step 1 and step 2 (and any following steps) are overlaid on a common coordinate system, and common defects (within some distance tolerance) across steps are flagged. By noting the first (i.e., earliest) step in which a defect was detected, its source can be determined.

One disadvantage of the currently used method is that very often the thresholds set at each step are conservative (for stability purposes). Therefore, the signal of a defect detected at a later inspection step, though present in that location at an earlier step, may not be flagged as a defect at that earlier step. In this manner, inspection results for the location at the earlier inspection step may simply not exist. Secondly, no use is made of the data at one step to affect the recipe used on that wafer at a subsequent step. For example, if some systematic (i.e., repeater) signal is present at certain locations, this information is not used at the next inspection step to, for example, enhance the possibility of detecting a defect event at the next step.

Accordingly, it would be advantageous to develop methods and systems for more efficient tracking of defects from one step to another.

SUMMARY OF THE INVENTION

The following description of various embodiments is not to be construed in any way as limiting the subject matter of the appended claims.

One embodiment relates to a computer-implemented method for determining care areas for inspection. The method includes acquiring inspection results for a wafer generated by a first inspection process. The first inspection process is performed on the wafer after a first fabrication step has been performed on the wafer and before a second fabrication step has been performed on the wafer. The method also includes determining care areas for a second inspection process based on the inspection results. The second inspection process will be performed on the wafer after the second fabrication step has been performed on the wafer. The acquiring and determining steps are performed using a computer system.

Each of the steps of the method described above may be further performed as described herein. In addition, the method described above may include any other step(s) of any other method(s) described herein. Furthermore, the method described above may be performed by any of the systems described herein.

Another embodiment relates to a non-transitory computer-readable medium containing program instructions stored therein for causing a computer system to perform a computer-implemented method for determining care areas for inspection. The computer-implemented method includes the steps of the method described above. The computer-readable medium may be further configured as described herein. The steps of the method may be performed as described further herein. In addition, the method may include any other step(s) of any other method(s) described herein.

An additional embodiment relates to a system configured to determine care areas for inspection. The system includes an inspection subsystem configured to generate inspection results for a wafer by performing a first inspection process. The first inspection process is performed on the wafer after a first fabrication step has been performed on the wafer and before a second fabrication step has been performed on the wafer. The system also includes a computer subsystem configured to determine care areas for a second inspection process based on the inspection results. The second. inspection process will be performed on the wafer after the second fabrication step has been performed on the wafer. The second inspection process may also be performed on the wafer after the first fabrication step on a more sensitive inspection system (such as an e-beam inspector or review station) based on results obtained from the first inspection process. The system may be further configured according to any embodiment(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
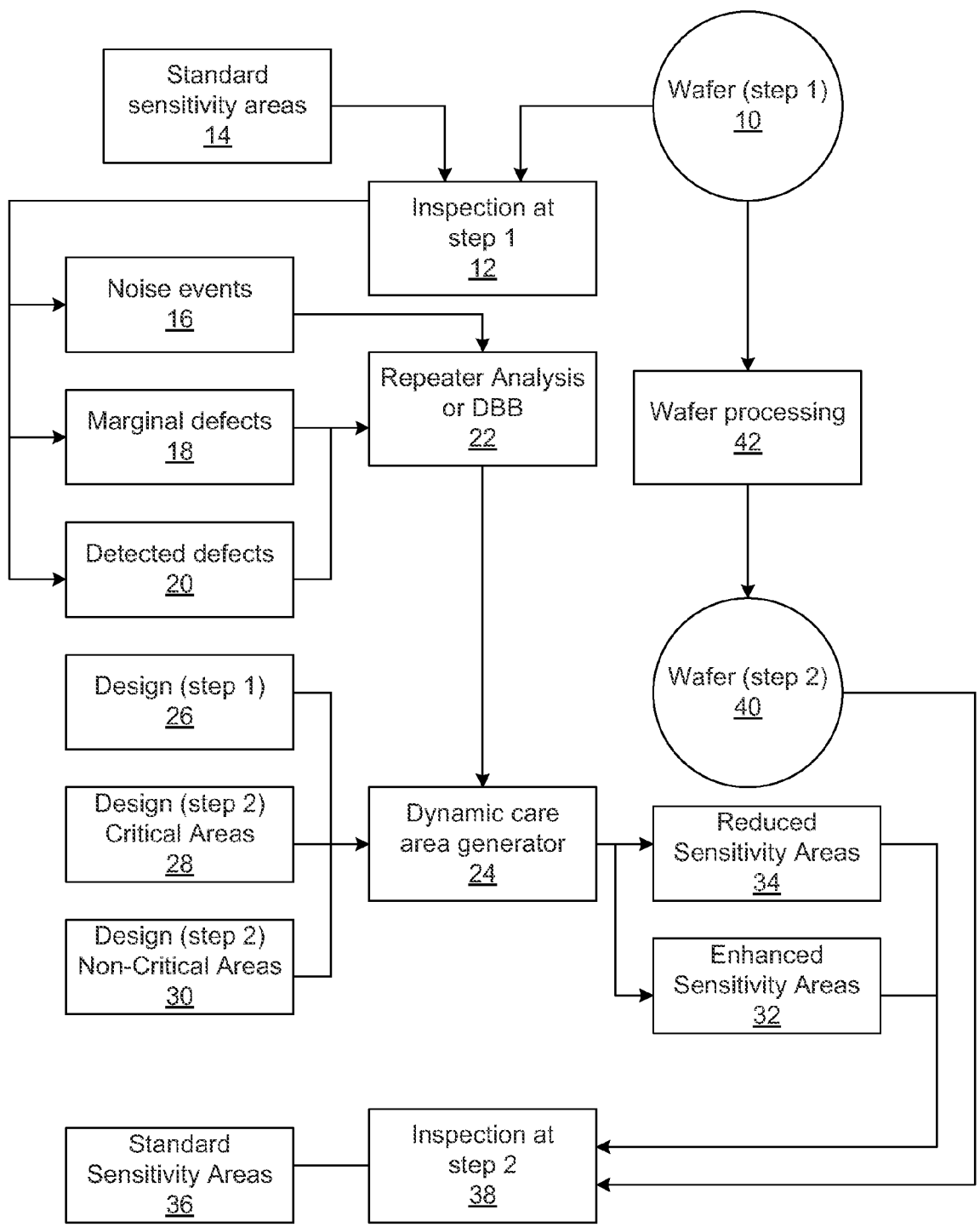
FIGS. 1-5 are flow charts of various method embodiments.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

In general, the embodiments described herein are related to dynamic micro care areas (MCAs) for inspection and/or review. The term "care areas" can be generally defined as areas on the wafer that a user cares about for some reason and therefore should be inspected. In one example of currently used care areas, care areas for one layer of a wafer may be defined such that the care areas include critical features that are formed on the layer and do not include non-critical features that are formed on the layer. A dynamic MCA is a care area generated based on results of an inspection or automated defect review step performed on a wafer for use by a subsequent inspection or review step performed on the same wafer.

One embodiment relates to a computer-implemented method for determining care areas for inspection. The method includes acquiring inspection results for a wafer generated by a first inspection process. Acquiring the inspection results may include actually performing the first inspection process on the wafer (e.g., by scanning the wafer using an inspection tool and detecting defects on the wafer using output generated by the scanning). However, acquiring the inspection results may not include performing the first inspection process. For example, acquiring the inspection results may include acquiring the inspection results from a storage medium in which the inspection results have been stored by another method or system (e.g., another method or system that performed the first inspection process). The first inspection process may include any suitable inspection process including any of those described further herein. The first inspection process may include performing a hot recipe at the first inspection process (inspection step 1) that generates inspection results such as defect locations. The inspection results may include any and all inspection results that may be generated by an inspection process.

The first inspection process is performed on the wafer after a first fabrication step has been performed on the wafer and before a second fabrication step has been performed on the wafer. A "fabrication step" as used herein generally refers to any semiconductor fabrication process that involves changing the wafer in some manner physically, chemically, mechanically, etc. For example, a fabrication step may include a lithography process, an etch process, a chemical-mechanical polishing process, and the like. In one such example, the first fabrication step may be a lithography process, and the second fabrication step may be an etch process. The first and second fabrication steps may be performed one after the other on the wafer (e.g., without performing any other fabrication steps on the wafer between the first and second fabrication steps). In contrast, processes that may be performed on a wafer that do not include intentionally altering the wafer include inspection and review processes.

The method also includes determining care areas for a second inspection process based on the inspection results. The second inspection process will be performed on the wafer after the second fabrication step has been performed on the wafer. Determining the care areas may include determining the locations or areas on the wafer that will be inspected and one or more inspection parameters that will be used to detect defects in each of the care areas. The one or more inspection parameters determined for some care areas may be different than the one or more inspection parameters determined for other care areas. For example, the method allows the sensitivity for a given inspection step in selected regions of a specific wafer to be tailored to noise and signals detected on that specific wafer by an inspection at an earlier step. In other words, the method may utilize inspection results from one inspection step to enhance or detune sensitivity of the wafer at a subsequent inspection step or steps. In this manner, the method may correlate an inspection step performed after one fabrication process with an inspection step performed after the next or another fabrication process.

In one such example, a subtle signal, not flagged as a defect at inspection step 1, can be used to improve the probability of catching a defect at the second inspection process (inspection step 2) by sensitizing the threshold at that location. In this manner, the dynamic care areas determined as described herein may be used to track signals for a given wafer from one fabrication step to the next in order to better flag defect generation sources at their origin (i.e., at the fabrication step at which they originated). For example, subtle defects detected at a lithography step (e.g., by after develop inspection (ADI)) can generate defects (such as shorts and opens) at a subsequent etching step. In this manner, in order to correlate defects at a subsequent step (or step 2) with signals detected at the earlier step (or step 1) special care areas are generated from the step 1 inspection results. These care areas are inspected at step 2 with enhanced sensitivity so as to maximize the chance of catching defects that perhaps originated at step 1.

In most semiconductor fabrication facilities, inspection recipes are run fairly cold to provide stability of results to small changes in processes that do not affect yield. By selectively enhancing sensitivity in the areas on a per wafer basis, one can better detect defects in critical areas based on signals recorded from an earlier inspection of that wafer without giving up much on stability.

Acquiring the inspection results and determining the care areas are performed using a computer system, which may be configured as described herein.

In order for the schemes described herein to work to their maximum potential, the care areas should be substantially accurately aligned to design space so that their placement at step 2, based on their locations recorded in step 1, is substantially accurate. For example, dynamic MCAs are preferably used with methods that have substantially high accuracy in care area placement (e.g., or pixel-to-design alignment (PDA)) across inspection tools and/or optics modes of one or more inspection tools. In general, the dynamic MCAs may be determined to have one or more characteristics that account for the uncertainty in care area placement between step 1 and step 2. Methods and systems for aligning design space to inspection or wafer space are described in commonly owned U.S. Pat. No. 7,676,077 to Kulkarni et al., which is incorporated by reference as if fully set forth herein. Any of the methods and systems described in this patent may be used in the methods described herein to align the design space to inspection or wafer space and vice versa.

In one embodiment, the inspection results include noise events, marginal defects, and detected defects, and the care areas are determined such that the care areas include locations of at least some of the noise events, the marginal defects, and the detected defects. Noise events can be generally defined as signals that have values that are above the noise floor and are closer to the noise floor than to the defect detection threshold. Marginal defects can be generally defined as signals that have values that are below the defect detection threshold and are closer to the defect detection threshold than to the noise floor. As shown in FIG. 1, wafer (at step 1) 10 may be inspected by inspection (at step 1) 12 using standard sensitivity care areas 14. This inspection generates three types of events: significant noise events 16, marginal defects 18, that are just below the detection thresholds at this step, and detected defects 20 that are above the detection thresholds. The locations of the noise events, marginal defects, and detected defects can be used to determine the locations of the care areas of the subsequent inspection step. In this manner, the method may include utilizing inspection results from one inspection step to sensitize or desensitize inspection of the wafer at a subsequent inspection step by utilizing the spatial location of a defect or signal at the first step.

In another embodiment, the method includes performing repeater analysis using the inspection results, and determining the care areas is performed based on results of the repeater analysis. In this manner, the embodiments described herein may utilize inspection results from one inspection step to sensitize or desensitize inspection of the wafer at a subsequent inspection step by utilizing the repeating nature of the defects or signals at the first step. For example, generation of the dynamic care areas can be enhanced by performing repeater analysis of the signals from step 1. In one such example, as shown in FIG. 1, noise events 16, marginal defects 18, and detected defects 20 generated by inspection (at step 1) 12 may be used as input to repeater analysis 22. Repeater analysis can use die-repeater information (e.g., by overlaying events on a die-relative coordinate space) or care area group ID (CAGID) information based on, for example, data from a run-time context map (RTCM), generated for a design context-based inspection (CBI) recipe at step 1, or design-based classification (DBC), a post-processing step using design clips around defect/event locations. A RTCM can be generated and CBI can be performed as described in the above-referenced patent to Kulkarni et al. DBC can be performed as described in commonly owned U.S. Pat. No. 7,570,796 to Zafar et al. issued on Aug. 4, 2009, which is incorporated by reference as if fully set forth herein. The output of this process is a set of tagged defects, marginal defects, and noise based on their repeater priority (e.g., how often the event repeats in a die and across dies).

In some embodiments, the inspection results include noise events, marginal defects, and detected defects, the method includes determining design-based information for at least some of the noise events, marginal defects, and detected defects, and determining the care areas is performed based on the design-based information. For example, the method may include utilizing inspection results from one inspection step to sensitize or desensitize inspection of the wafer at a subsequent inspection step by utilizing the design context of the defect or signal at the first step. In this manner, the method may generate MCAs for use at inspection step 2 from inspection step 1 lot results and a context map.

Figure 2:
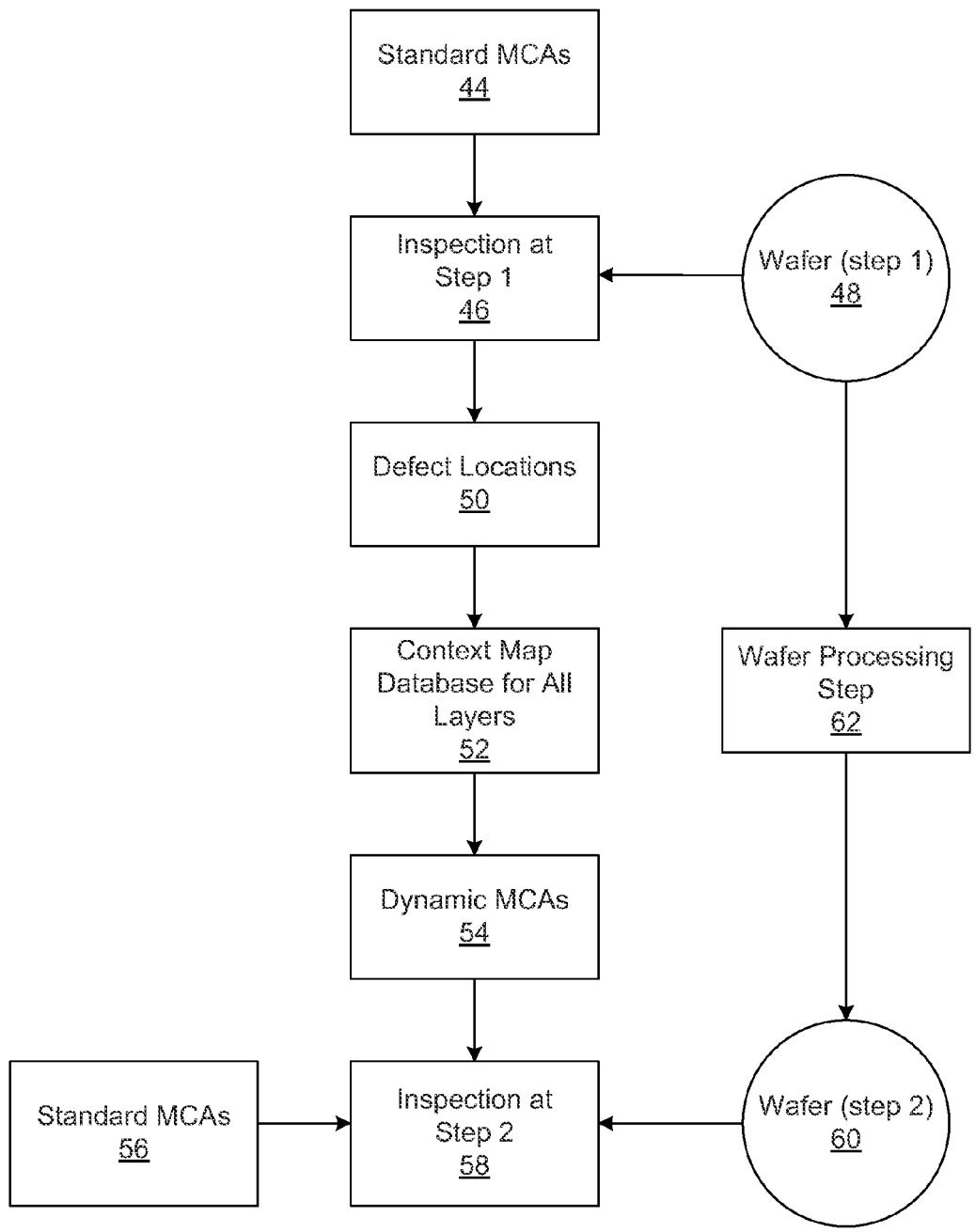

In one such example, the defect locations in the inspection results may be mapped to design context to determine the design context for individual defects. In this manner, design context and/or other wafer image properties can be used to generate the dynamic MCAs. In another example, the generation of the dynamic care areas can be enhanced by performing analysis of the signals from step 1 utilizing design-based binning (DBB). In one such example, as shown in FIG. 1, noise events 16, marginal defects 18, and detected defects 20 generated by inspection (at step 1) 12 may be used as input to DBB 22. DBB can be performed as described in the above-referenced patent to Zafar et al. In another such example, as shown in FIG. 2, standard MCAs 44 may be used for inspection (at step 1) 46 of wafer (step 1) 48. Inspection 46 may generate inspection results such as defect locations 50, which may be used with context map database for all layers 52 to generate dynamic MCAs 54.

In one embodiment, an inspection recipe for the second inspection process includes first care areas, and determining the care areas includes altering a sensitivity with which defects are detected in at least some of the first care areas. A "recipe" may be generally defined as a set of instructions for carrying out a process such as inspection. The sensitivity may be defined by one or more parameters (e.g., a threshold) of a defect detection algorithm and/or method. For example, certain portions of traditional care areas at step 2 may be detuned or enhanced in sensitivity using the dynamically generated areas.

In another embodiment, an inspection recipe for the second inspection process includes first care areas, and determining the care areas includes altering a sensitivity with which defects are detected in at least some of the first care areas based on the inspection results and criticalities of the first care areas. In this manner, critical contexts can be used to generate dynamic MCAs for the second inspection process. For example, knowledge of critical versus non-critical regions at step 2 can be utilized to enhance or detune sensitivity in selected regions at that step. In one such example, as shown in FIG. 1, the tagged defect/event data may be used as input to dynamic care area generation process 24. Also input to this process may be the design data (from step 1) 26, the critical areas (at step 2) 28, and the non-critical areas (at step 2) 30. The dynamic care area generation process generates areas for sensitizing inspection (at step 2) 32 or desensitizing inspection (at step 2) 34. For example, if certain geometries show relatively noisy behavior at step 1 and lie in a non-critical region at step 2, these regions can be desensitized to reduce nuisance at step 2. Table 1 below gives some possible actions that can be taken by this process based on the type of event detected at step 1.

TABLE 1

Action Taken at Step 2 Inspection based on Step 1 Inspection Results

| Step 1 Event | No signal, no noise | Noise (non-repeating) | Noise (repeating) | Signal (non-repeating) | Signal (repeating) | Defect (non-repeating) | Defect (repeating) |
|---|---|---|---|---|---|---|---|
| Step 2 non-critical area | No change | No change | Desensitize | No change | Desensitize | No change | No change |
| Step 2 Moderately critical area | No change | No change | No change | Sensitize | Sensitize | Sensitize | Sensitize |
| Step 2 critical area | No change | No change | Sensitize | Sensitize | Sensitize | Sensitize | Sensitize |

The above table is given as an example and could be tailored for specific use-cases.

In an additional embodiment, an inspection recipe for the second inspection process includes first care areas, and determining the care areas includes generating second care areas for the second inspection process that are different than the first care areas. For example, the second care areas may be determined independently of the first care areas. In addition, the second care areas may be mutually exclusive of the first care areas. In particular, at least some of the second care areas may not overlap with any of the first care areas. In any case, the second care areas may have one or more characteristics that are different than the first care areas. For example, the first and second care areas may have different locations on the wafer, different dimensions on the wafer, and the like. The second care areas may be standard care areas described further herein and may be generated in any manner using any suitable process or system.

In some embodiments, an inspection recipe for the second inspection process includes first care areas, and the second inspection process is performed using the first care areas and the determined care areas. For example, the traditional care areas at step 1 and step 2 may still be used during inspection. In one such example, as shown in FIG. 1, standard care areas 36 may be used in addition to the reduced sensitivity areas and the enhanced sensitivity areas for inspection (at step 2) 38 of wafer (step 2) 40 after wafer processing 42 has been performed on wafer (step 1) 10. In another such example, as shown in FIG. 2, standard MCAs 56 may be used in addition to dynamic MCAs 54 for inspection (at step 2) 58 of wafer (step 2) 60 after wafer processing 62 has been performed on wafer (step 1) 48. In this manner, dynamic MCAs can coexist with static MCAs in inspection recipes. In addition, dynamic MCAs with hotter thresholds can be used along with standard (static) MCAs at the second inspection process.

In one embodiment, the method includes, after the second fabrication step has been performed on the wafer, performing the second inspection process on the wafer using the determined care areas and determining if a noise event, a marginal defect, or a detected defect included in the inspection results generated by the first inspection process correlates to a defect detected in the determined care areas by the second inspection process. In this manner, the method may include determining the fabrication step at which defects originate in the wafer fabrication process. For example, the method may utilize inspection results from one inspection step to sensitize inspection of the wafer at a subsequent inspection step in order to identify the source of a defect mechanism. In this manner, the dynamic MCAs described herein can help in defect source identification (identification of the fabrication step at which the defect originated). In one such example, dynamic MCAs with hotter thresholds may be used along with standard (static) MCAs at the second inspection process. As such, critical defects that started after the first fabrication step are more likely to be caught at the second inspection process. In addition, since dynamic MCAs may cover a smaller area than typical care areas, there is a lower risk of nuisance at the second inspection process. The defects that can be tracked in this manner include systematic defect mechanisms, i.e., defects that occur in similar design geometry context. For example, by utilizing repeater analysis and/or CAGID or DBC of noise and marginal defects at step 1 and then tracking them in step 2, one increases the possibility of catching systematic defect mechanisms that might have originated at step 1. In this manner, the concept of dynamic care areas provides a method of tracking and feeding forward defect signal information from one wafer fabrication step to the next so that defect sources (the step at which they originated) can be determined in a timely manner and systematic defect mechanisms can be flagged early on in the process.

Currently used methods for defect source analysis (DSA) use defect location information from plan of record (POR) recipes at each step (step 1, 2, etc.) and then overlay them on a die-relative coordinate system to find defect sources. In contrast, the embodiments described herein may use defects plus marginal defects as well as repeater information to actually alter the sensitivity of selected areas on the subsequent inspection of that wafer. Hence, it is a wafer-specific operation that is concurrent with the normal inspection operation at each step. This concept of carrying forward information from one inspection step to the next inspection step is new.

In one embodiment, the first and second inspection processes are performed on the same inspection tool. In another embodiment, the first and second inspection processes are performed on different inspection tools. For example, the wafer may be inspected on the same or different tools at the two inspection steps. In particular, the embodiments may utilize inspection results from one inspection step to sensitize or desensitize inspection of the wafer at a subsequent inspection step where the two inspection steps use the same inspection tool or different inspection tools. The two inspection tools may include any commercially available inspection tools such as those from KLA-Tencor, Milpitas, Calif., In addition, the same inspection tool may be a single inspection tool or different inspection tools of the same make and model. Different inspection tools may include different inspection tools of the same make and model or completely different inspection tools having different makes and models and/or different output acquisition configurations (e.g., different optical setups, platforms, etc.). Regardless of whether one or more tools are used across a fab at different inspection points, such a feed-forward mechanism provides added value to the user. In addition, the methods involve inspector-to-inspector coupling (after different process steps), which can be used for defect source identification as described further herein.

In some embodiments, the method is performed on a per wafer basis. For example, as described further herein, the method may generate per wafer MCAs based on lot results for that wafer, which may include information such as marginal defects, and those MCAs may be used at a subsequent inspection step for that same wafer. In this manner, the dynamic MCAs vary from wafer to wafer.

Note that this process of propagating care areas can be carried over more than two consecutive fabrication steps though the likelihood of preserving and detecting a defect past a couple of fabrication processing steps is low in most cases. It is also possible that certain defects, for example, fall-on particles or marginal defects detected at one step may be "cleaned up" in an intermediate fabrication step before the next inspection step.

The embodiments described herein have a number of advantages over other currently used methods. For example, the embodiments described herein automate the generation of dynamic care areas to optimize defect of interest (DOI) capture across fabrication process steps on a per wafer basis. In contrast, during product demos, application engineers often use manually drawn MCAs to find defects that the normal inspection recipe does not catch. In addition, engineers may use stored images of a wafer at each fabrication process step to manually drive back to certain locations once defects have been caught at a later fabrication step. The embodiments described herein, however, may incorporate algorithms and system connectivity that could automate these manual methods so that they can be deployed on a wider scale. In addition, the embodiments described herein are advantageous in that manual methods are ad hoc and difficult to reproduce across users. Manual methods are also sub-optimal since it is not practical to manually go through vast amounts of data and perform the drive-back to stored image locations. In addition, the steps described herein that are performed automatically through algorithms and/or methods and system connectivity can be performed manually but this would be extremely tedious and sub-optimal. Furthermore, the dynamic care areas described above and the dynamic review samples described further herein provide a vehicle for coupling equipment together to provide higher value than is possible by using this equipment separately.

Figure 3:
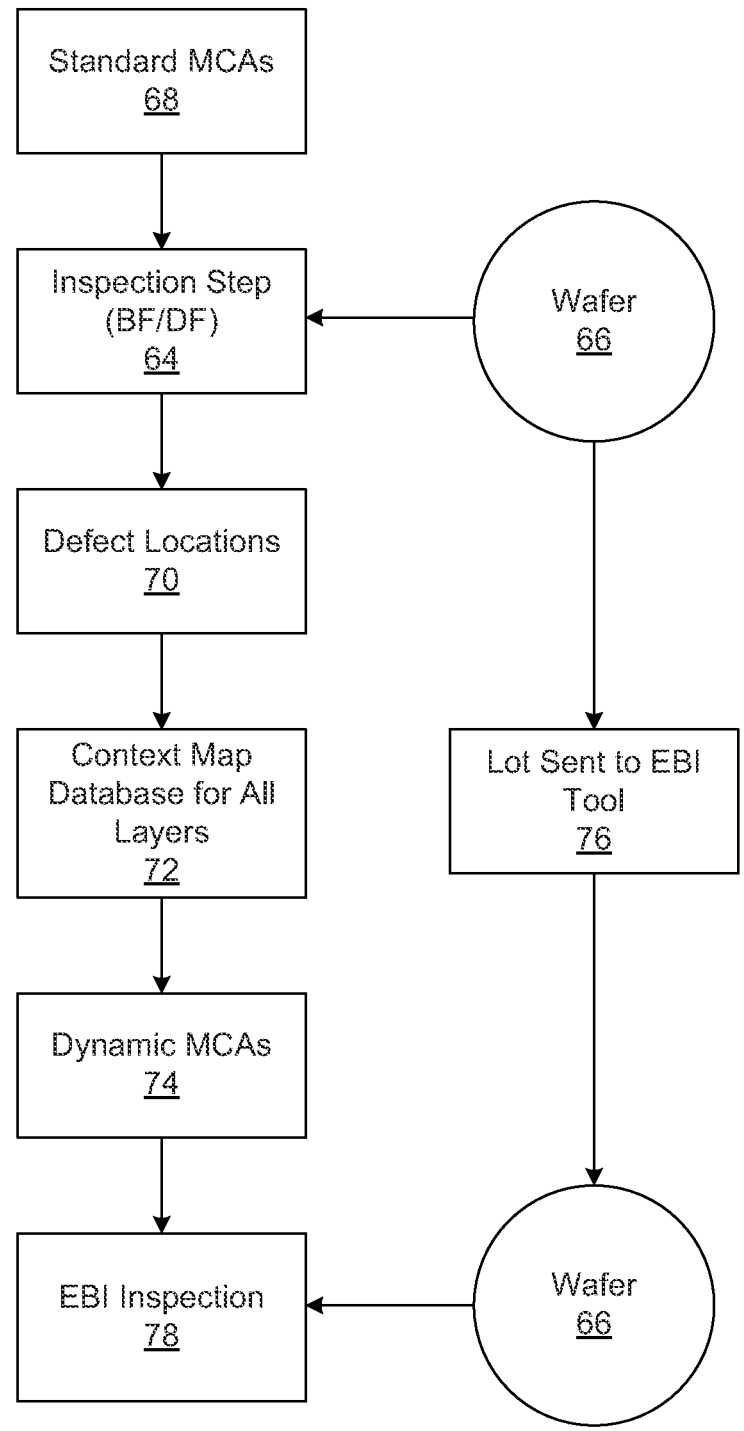

In one embodiment, the method includes determining care areas for an additional inspection process based on the inspection results. The additional inspection process is performed on the wafer before the second fabrication step and at a higher resolution than the first inspection process. In this manner, the method may correlate one inspection step to another inspection step, both of which are performed at the same process level. In other words, the method may include inspector to inspector coupling (after the same fabrication step). For example, as shown in FIG. 3, the method may include performing inspection step 64 on wafer 66 using standard MCAs 68. Inspection step 64 may be performed using bright field (BF) inspection, dark field (DF) inspection, or BF/DF inspection. The inspection results generated by inspection step 64 may include defect locations 70. The defect locations may be generated using a hot recipe at inspection step 64. The defect locations may be used with context map database for all layers 72 to generate dynamic MCAs 74. For example, the defect locations may be mapped to design context using the context map database. The additional inspection process may be an electron beam inspection (EBI), which is performed at a higher resolution than a BF, DF, or BF/DF inspection process. In this manner, the method may include generating MCAs from BF or DF inspection step lot results and context map for use at EBI (or other sampled high resolution inspection). Most defect die and critical contexts are used to generate the sample plan and dynamic MCAs for EBI. Wafer 66 may be included in lot sent to EBI tool 76 such that wafer 66 may be inspected by EBI 78 using dynamic MCAs 74. The dynamic MCAs and a smaller sample plan may be used for inspecting on EBI. As a result, the most critical areas are inspected at substantially high resolution on EBI providing better defect capture. The smaller sample plan and limited dynamic MCA ensure that EBI scan time is reasonable.

In one such embodiment, the method includes classifying defects detected on the wafer by the first and additional inspection processes based on the inspection results and results of the additional inspection process. In this manner, the method may include combining the results of high speed, medium resolution inspection tools (such as BF tools) and sampled inspection on slower but higher resolution tools such as EBI tools to generate a better quality defect Pareto than can be done using one tool alone. In other words, a higher quality Pareto can be generated by combining high resolution sampling with high speed, medium resolution inspection. In addition, the above sample generation may be performed automatically.

In some embodiments, the method includes reviewing defects on the wafer based on the inspection results using a first review process and determining a sampling plan for a second review process based on results of the first review process. Therefore, this embodiment may include performing a dynamic review sampling strategy. For example, the methods may include generating a second pass review sample using lot results. The adaptive review sample plan may use classified results from a first pass review to improve the probability of finding systematic defects. In this manner, dynamic MCAs for review can help in systematic defect discovery (discovering defects occurring at similar design locations). In addition, the adaptive defect review sample (e.g., a scanning electron microscopy (SEM) sample) may use classified defects in the first pass in combination with design context. For example, the method may include using SEM/automatic defect classification (ADC) classified results of review and context map and hot lot results to generate a dynamic SEM sample of defects to be visited.

Figure 4:
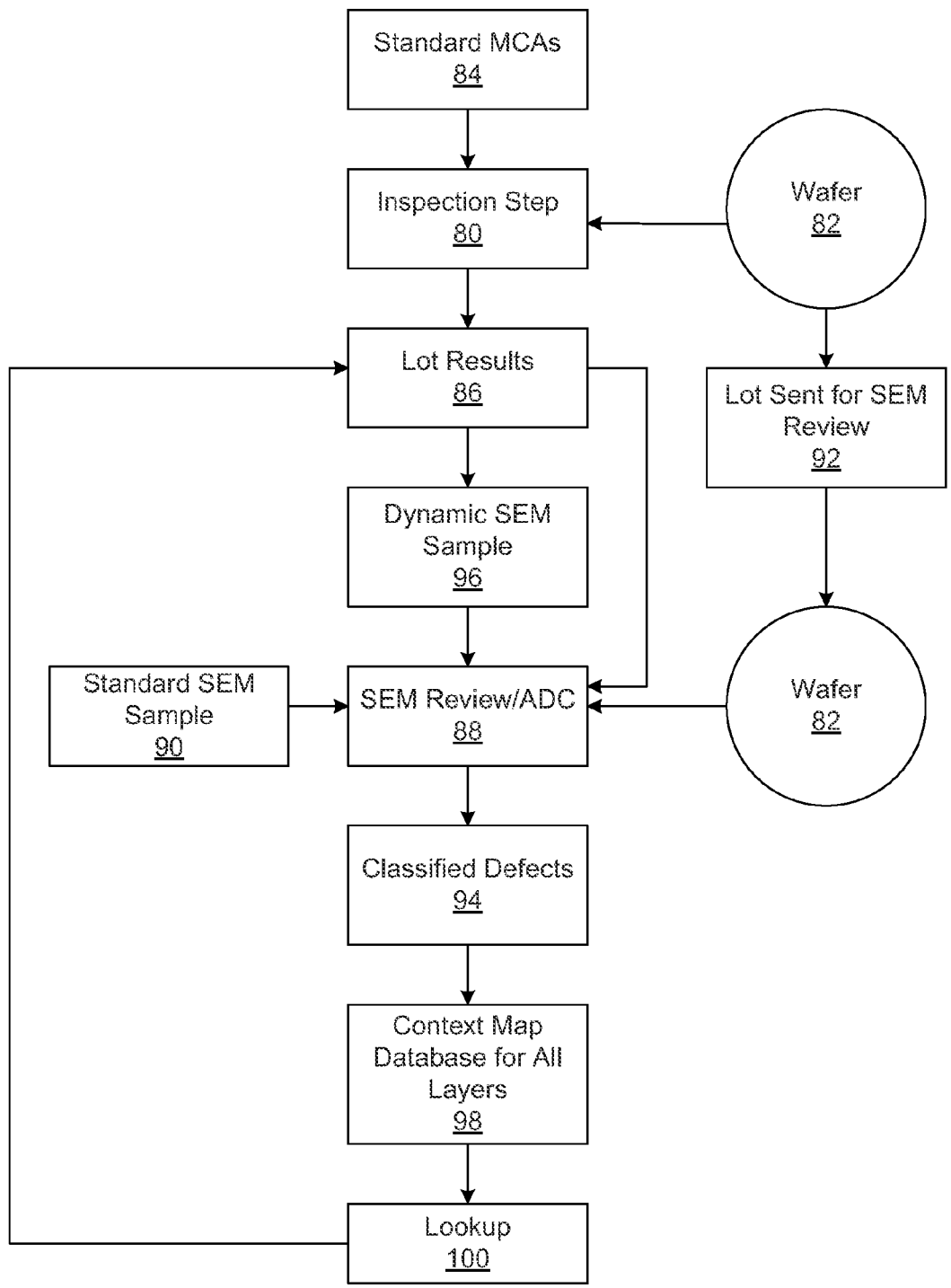

In one example, as shown in FIG. 4, the method may include inspection step 80 that is performed on wafer 82 using standard MCAs 84. Results of the inspection step include lot results 86. The inspection step may include using a hot recipe at the inspection step to generate defect locations. SEM review/ADC 88 may be performed using lot results 86 and standard SEM sample 90 on wafer 82 included in lot sent for SEM review 92. Classified defects 94 may be produced by SEM review/ADC 88. For example, the standard SEM sample from the lot results are SEMed and auto-classified on the review tool. The classified defects can be used to generate dynamic SEM sample 96. In this manner, a dynamic SEM sample can be generated from the classified defects for SEM review/classification. For example, the classified defects can be input to context map database for all layers 98. In this manner, the classified results are mapped to design context. The mapped classified results are used to perform lookup 100 in lot results 86. For example, found DOI are used to locate defects found in similar contexts in the lot results. The results of the lookup step performed using lot results 86 may be used to generate dynamic SEM sample 96, which can be used to perform another SEM review/ADC 88. In this manner, the method shown in FIG. 4 provides review to review coupling for dynamic sampling that can be used for systematic defect discovery. For example, the dynamic sample is more likely to catch a systematic defect mechanism that would tend to occur in the same design context.

In a further embodiment, the method includes reviewing defects on the wafer based on the inspection results using a first review process and determining a sampling plan for a second review process based on results of the first review process and stored output of the first inspection process. The output of the first inspection process may be stored in a virtual inspector (VI), which may be configured as described in commonly owned U.S. Patent Application Publication No. 2009/0080759 by Bhaskar et al. published on Mar. 26, 2009, which is incorporated by reference as if fully set forth herein. In this manner, the method may include generating a second pass review sample from playback of a hotter recipe. Therefore, this embodiment may include performing a dynamic review sampling strategy. For example, the method may include using first pass SEM/ADC classified results and context map to generate MCAs for a hot or hotter recipe for VI image playback in selected areas of the stored image (selected areas of the wafer or a die on the wafer), the results of which will be sampled for defect review such as SEM (a dynamic second pass defect review sample). The adaptive review sample plan may use classified results and selective playback of stored image data to improve the probability of finding systematic defects. As such, the method may be together a review tool, an inspection tool, VI storage, and an adaptive sampling algorithm to find systematic defects with a higher degree of confidence than with static review sampling schemes used today. In this manner, the method may involve review to review coupling for re-scan sampling that can be used for systematic defect discovery.

Figure 5:
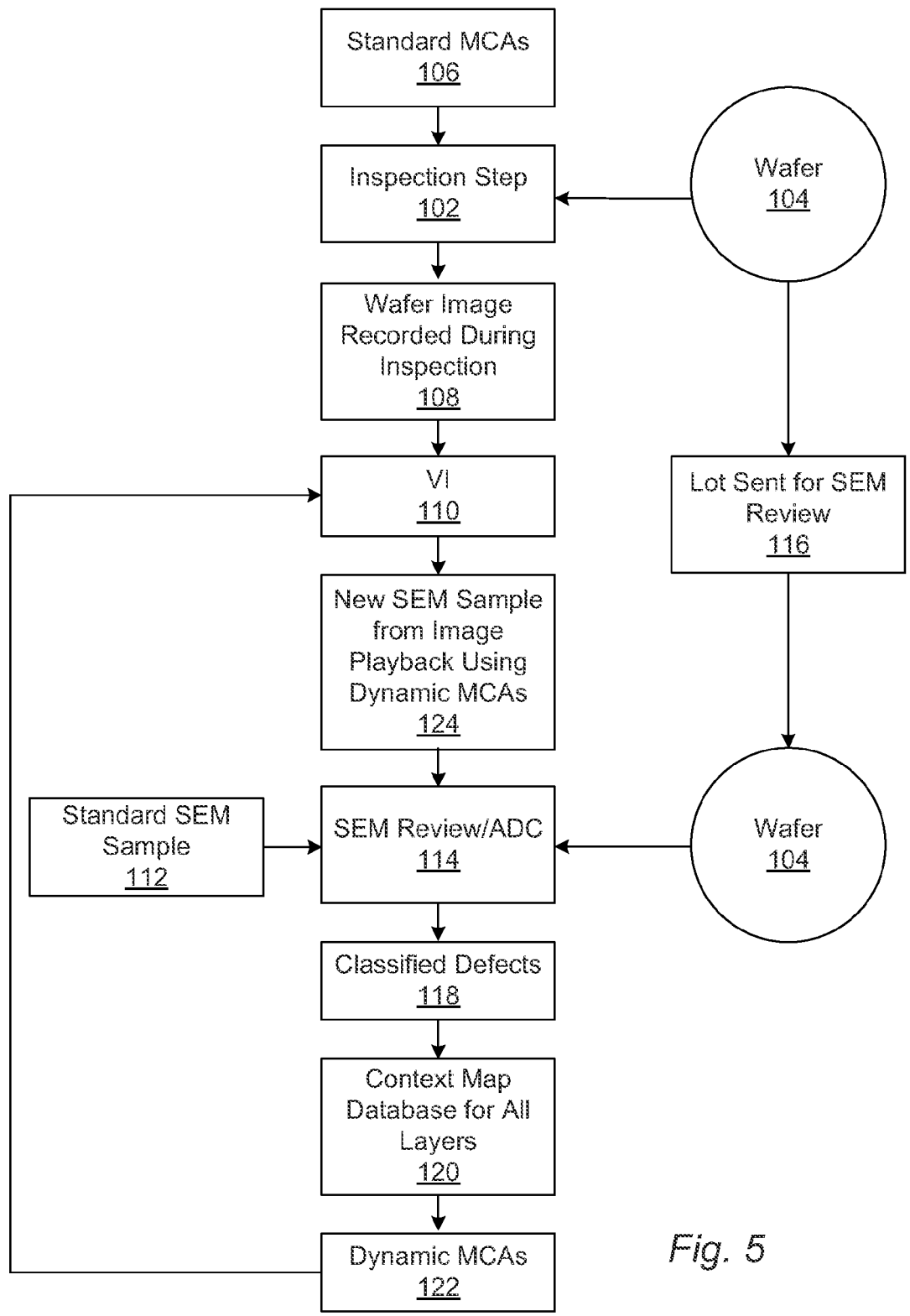

In one such example, as shown in FIG. 5, inspection step 102 may be performed on wafer 104 using standard MCAs 106. Wafer image recorded during inspection 108, which may be POR inspection, may be stored in VI 110. Standard SEM sample 112 may be used to perform SEM review/ADC 114 on wafer 104 included in lot sent for SEM review 116. Results of SEM review/ADC include classified defects 118. For example, the standard SEM sample from lot results may be SEMed and auto-classified on a review tool. Classified defects 118 may be input to context map database for all layers 120 to produce dynamic MCAs 122. For example, the classified results may be mapped to design context and dynamic MCAs are generated for critical defects and corresponding design contexts. Dynamic MCAs 122 may be input to VI 110 to produce new SEM sample from image playback 124. For example, the wafer image may be played back with a hotter recipe (than original) using the dynamic MCAs. The new SEM sample from image playback may then be sent for SEM review, which may be used to perform an additional SEM review/ADC of wafer 104 (the wafer may still be at the review tool). As a result, the hotter playback recipe is more likely to catch systematic defects in similar contexts that were not caught by the colder POR recipe.

All of the methods described herein may include storing results of one or more steps of the method embodiments in a non-transitory, computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, after the method determines the care areas, the method may include storing the care areas in an inspection recipe in a storage medium. In addition, results or output of the embodiments described herein may be stored and accessed by a wafer inspection system such as those described further herein such that the wafer inspection system can use the care areas for inspection.

Each of the embodiments of the method described above may include any other step(s) of any other method(s) described herein, in addition, each of the embodiments of the method described above may be performed by any of the systems described herein.

Figure 6:
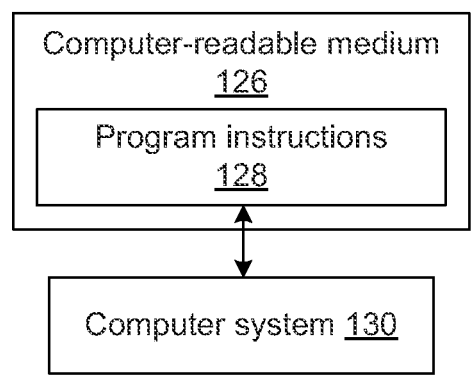
FIG. 6 is a block diagram illustrating one embodiment of a non-transitory computer-readable medium.

Another embodiment relates to a non-transitory computer-readable medium containing program instructions stored therein for causing a computer system to perform a computer-implemented method for determining care areas for inspection. One embodiment of such a computer-readable medium is shown in FIG. 6. In particular, computer-readable medium 126 contains program instructions 128 stored therein for causing computer system 130 to perform a computer-implemented method for determining care areas for inspection.

The computer-implemented method includes acquiring inspection results for a wafer generated by a first inspection process, which may be performed as described herein. The first inspection process is performed on the wafer after a first fabrication step has been performed on the wafer and before a second fabrication step has been performed on the wafer. The computer-implemented method also includes determining care areas for a second inspection process based on the inspection results, which may be performed as described herein. The second inspection process will be performed on the wafer after the second fabrication step has been performed on the wafer. The computer-implemented method may include any other step(s) of any other method(s) described herein. In addition, the computer-readable medium may be further configured as described herein.

Program instructions 128 implementing methods such as those described herein may be stored on computer-readable medium 126. The computer-readable medium may be a non-transitory computer-readable storage medium such as a read-only memory, a random access memory, a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Computer system 130 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

Figure 7:
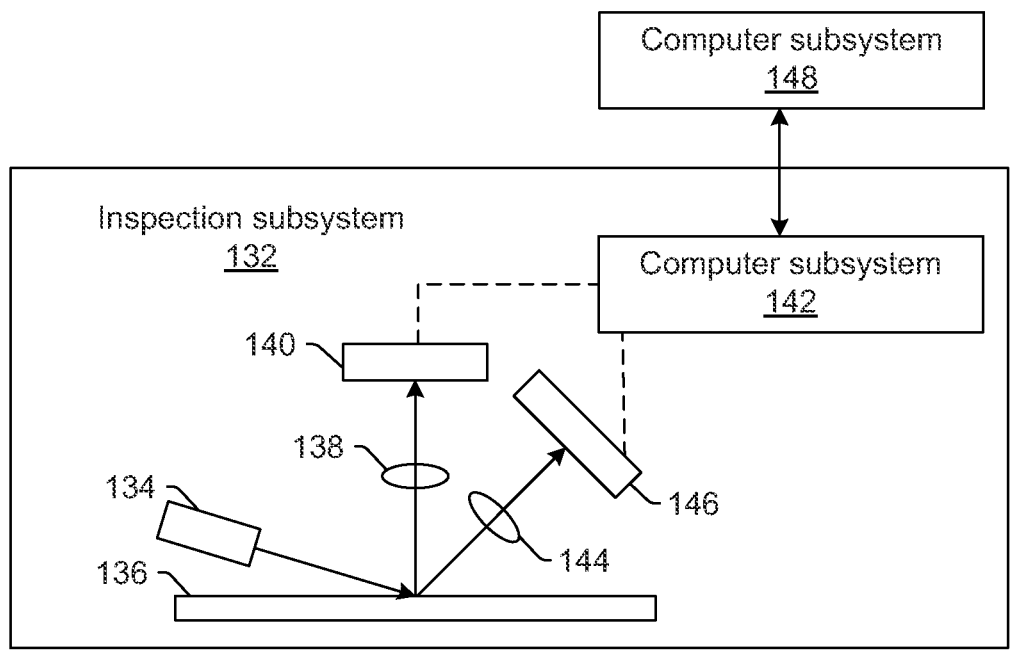
FIG. 7 is a schematic diagram illustrating a side view of an embodiment of a system configured to determine care areas for inspection.

FIG. 7 illustrates one embodiment of a system configured to determine care areas for inspection. The system includes inspection subsystem 132 configured to generate inspection results for a wafer by performing a first inspection process. The first inspection process is performed on the wafer after a first fabrication step has been performed on the wafer and before a second fabrication process has been performed on the wafer.

The inspection subsystem may include an illumination subsystem. For example, as shown in FIG. 7, the illumination subsystem includes light source 134. Light source 134 may include any suitable light source known in the art such as a laser. Light source 134 is configured to direct light to wafer 136 at an oblique angle of incidence, which may include any suitable oblique angle of incidence. The illumination subsystem may also include one or more optical components (not shown) that are configured to direct light from light source 134 to wafer 136. The optical components may include any suitable optical components known in the art. In addition, the light source and/or the one or more optical components may be configured to direct the light to the wafer at one or more angles of incidence (e.g., an oblique angle of incidence and/or a substantially normal angle of incidence).

Light scattered from wafer 136 may be collected and detected by multiple detection subsystems or multiple channels of the inspection subsystem. For example, light scattered from wafer 136 at angles relatively close to normal may be collected by lens 138 of one detection subsystem. Lens 138 may include a refractive optical element as shown in FIG. 7. In addition, lens 138 may include one or more refractive optical elements and/or one or more reflective optical elements. Light collected by lens 138 may be directed to detector 140 of that detection subsystem. Detector 140 may include any suitable detector known in the art such as a charge coupled device (CCD). Detector 140 is configured to generate output that is responsive to the light scattered from the wafer. Therefore, lens 138 and detector 140 form one channel of the inspection subsystem. This channel of the inspection subsystem may include any other suitable optical components (not shown) known in the art such as a polarizing component and/or a Fourier filtering component. The inspection subsystem is configured to detect defects on the wafer using the output generated by detector 140. For example, a computer subsystem (e.g., computer subsystem 142) of the inspection subsystem may be configured to detect defects on the wafer using the output generated by the detector.

Light scattered from wafer 136 at different angles may be collected by lens 144 of another detection subsystem. Lens 144 may be configured as described above. Light collected by lens 144 may be directed to detector 146 of this detection subsystem, which may be configured as described above. Detector 146 is also configured to generate output that is responsive to the light scattered from the wafer. Therefore, lens 144 and detector 146 may form another channel of the inspection subsystem. This channel may also include any other optical components described above. In some embodiments, lens 144 may be configured to collect light scattered from the wafer at polar angles from about 20 degrees to over 70 degrees. In addition, lens 144 may be configured as a reflective optical element (not shown) that is configured to collect light scattered from the wafer at azimuthal angles of about 360 degrees. The inspection subsystem is configured to detect defects on the wafer using the output generated by detector 146, which may be performed as described above.

The inspection subsystem shown in FIG. 7 may also include one or more other channels. For example, the inspection subsystem may include an additional channel (not shown), which may include any of the optical components described herein, configured as a side channel. In one such example, the side channel may be configured to collect and detect light that is scattered out of the plane of incidence (e.g., the side channel may include a lens that is centered in a plane that is substantially perpendicular to the plane of incidence and a detector configured to detect light collected by the lens). The inspection subsystem may be configured to detect defects on the wafer using the output generated by a detector of the side channel.

The inspection subsystem also includes computer subsystem 142. For example, output generated by the detectors may be provided to computer subsystem 142, which may be coupled to each of the detectors (e.g., by one or more transmission media shown by the dashed lines in FIG. 7, which may include any suitable transmission media known in the art) such that the computer subsystem may receive the output generated by the detectors. The computer subsystem may generate the inspection results for the first inspection process using the output of one or more of the detectors in any suitable manner. For example, the computer subsystem may be configured to generate the inspection results by detecting noise events, marginal defects, and detected defects on a wafer using output generated for the wafer by the detector(s).

The system also includes computer subsystem 148 configured to determine care areas for a second inspection process based on the inspection results. The second inspection process will be performed on the wafer after the second fabrication step has been performed on the wafer. The computer subsystem may be coupled to the inspection subsystem in any suitable manner such that the computer subsystem can receive the inspection results from the inspection subsystem. The computer subsystem may be configured to determine the care areas according to any of the embodiments described herein. In addition, the computer subsystem may be further configured as described herein and may be configured to perform any other step(s) described herein.

Computer subsystem 148 may be configured as a standalone system that does not form part of a process, inspection, metrology, review, or other tool. In one such example, the system may include one or more components that are specifically designed (and optionally dedicated) to performing one or more of the computer-implemented methods described herein. In such an embodiment, computer subsystem 148 may be configured to receive and/or acquire data or information from other systems (e.g., inspection results from an inspection system) by a transmission medium that may include "wired" and/or "wireless" portions. In this manner, the transmission medium may serve as a data link between the computer subsystem and the other system. In addition, computer subsystem 148 may send data to another system via the transmission medium. Such data may include, for example, information about the care areas determined by the computer subsystem. Alternatively, computer subsystem 148 may form part of an inspection system, metrology system, defect review system, analysis system, or another tool.

It is noted that FIG. 7 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection subsystem (e.g., by adding functionality described herein to an existing inspection system) such as any of the inspection tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Further modifications and alternative embodiments of various aspects of the invention may be apparent to those skilled in the art in view of this description. For example, methods and systems for determining dynamic care areas are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining care areas for inspection, comprising:
acquiring inspection results for a wafer generated by a first inspection process, wherein the first inspection process is performed on the wafer after a first fabrication step has been performed on the wafer and before a second fabrication step has been performed on the wafer;
determining care areas for a second inspection process based on the inspection results generated by the first inspection process, wherein the second inspection process will be performed on the wafer after the second fabrication step has been performed on the wafer, wherein the inspection results generated by the first inspection process comprise locations on the wafer of noise events, marginal defects, and detected defects detected in the first inspection process, wherein the care areas for the second inspection process are determined such that the care areas include at least some of the locations on the wafer of at least some of the noise events the marginal defects, and the detected defects detected in the first inspection process, and wherein said acquiring and said determining are performed using a computer system;

after the second fabrication step has been performed on the wafer, performing the second inspection process on the wafer using the determined care areas; and determining if a noise event, a marginal defect, or a detected defect included in the inspection results generated by the first inspection process correlates to a defect detected in the determined care areas by the second inspection process.

2. The method of claim 1, further comprising performing repeater analysis using the inspection results generated by the first inspection process, wherein said determining the care areas is performed based on results of the repeater analysis.

3. The method of claim 1, further comprising determining design-based information for at least some of the noise events, marginal defects, and detected defects, and wherein determining the care areas is performed based on the design-based information.

4. The method of claim 1, wherein an inspection recipe for the second inspection process comprises first care areas, and wherein said determining the care areas comprises altering a sensitivity with which defects are detected in at least some of the first care areas.

5. The method of claim 1, wherein an inspection recipe for the second inspection process comprises first care areas, and wherein said determining the care areas comprises altering a sensitivity with which defects are detected in at least some of the first care areas based on the inspection results generated by the first inspection process and criticalities of the first care areas.

6. The method of claim 1, wherein an inspection recipe for the second inspection process comprises first care areas, and wherein said determining the care areas comprises generating second care areas for the second inspection process that are different than the first care areas.

7. The method of claim 1, wherein an inspection recipe for the second inspection process comprises first care areas, and wherein the second inspection process is performed using the first care areas and the determined care areas.

8. The method of claim 1, wherein the first and second inspection processes are performed on the same inspection tool.

9. The method of claim 1, wherein the first and second inspection processes are performed on different inspection tools.

10. The method of claim 1, wherein the method is performed on a per wafer basis.

11. The method of claim 1, further comprising determining care areas for an additional inspection process based on the inspection results generated by the first inspection process, wherein the additional inspection process is performed on the wafer before the second fabrication step and at a higher resolution than the first inspection process.

12. The method of claim 11, further comprising classifying defects detected on the wafer by the first and additional inspection processes based on the inspection results generated by the first inspection process and results of the additional inspection process.

13. The method of claim 1, further comprising reviewing defects on the wafer based on the inspection results generated by the first inspection process using a first review process and determining a sampling plan for a second review process based on results of the first review process.

14. The method of claim 1, further comprising reviewing defects on the wafer based on the inspection results generated by the first inspection process using a first review process and determining a sampling plan for a second review process based on results of the first review process and stored output of the first inspection process.

15. A non-transitory computer-readable medium containing program instructions stored therein for causing a computer system to perform a computer-implemented method for determining care areas for inspection, wherein the computer-implemented method comprises:

acquiring inspection results for a wafer generated by a first inspection process, wherein the first inspection process is performed on the wafer after a first fabrication step has been performed on the wafer and before a second fabrication step has been performed on the wafer;

determining care areas for a second inspection process based on the inspection results generated by the first inspection process, wherein the second inspection process will be performed on the water after the second fabrication step has been performed on the wafer, wherein the inspection results generated by the first inspection process comprise locations on the wafer of noise events, marginal defects, and detected defects detected in the first inspection process, and wherein the care areas for the second inspection process are determined such that the care areas include at least some of the locations on the wafer of at least some of the noise events, the marginal defects, and the detected defects detected in the first inspection process;

after the second fabrication step has been performed on the wafer, performing the second inspection process on the wafer using the determined care areas; and determining if a noise event, a marginal defect, or a detected defect included in the inspection results generated by the first inspection process correlates to a defect detected in the determined care areas by the second inspection process.

16. A system configured to determine care areas for inspection, comprising:

one or more inspection subsystems configured to generate inspection results for a wafer by performing a first inspection process, wherein the first inspection process is performed on the wafer after a first fabrication step has been performed on the wafer and before a second fabrication process has been performed on the wafer; and one or more computer configured to determine care areas for a second inspection process based on the inspection results generated by the first inspection process, wherein the second inspection process will be performed on the water after the second fabrication step has been performed on the wafer, wherein the inspection results generated by the first inspection process comprise locations on the wafer of noise events, marginal defects, and detected defects detected in the first inspection process, and wherein the care areas for the second inspection process are determined such that the care areas include at least some of the locations on the wafer of at least some of the noise events, the marginal defects, and the detected defects detected in the first inspection process;

wherein after the second fabrication step has been performed on the wafer, the one or more inspection subsystems are configured to perform the second inspection process on the wafer using the determined care areas; and wherein the one or more computer subsystems are further configured to determine if a noise event, a marginal defect, or a detected defect included in the inspection result generated by the first inspection process correlates to a defect detected in the determined care areas by the second inspection process.

* * * * *